United States Patent
Tada

[11] Patent Number: 5,616,427
[45] Date of Patent: Apr. 1, 1997

[54] ORGANIC THIN FILM EL DEVICE HAVING LONG LIFETIME

[75] Inventor: Hiroshi Tada, Tokyo, Japan

[73] Assignee: NEC Corporation, Tokyo, Japan

[21] Appl. No.: 658,660

[22] Filed: Jun. 5, 1996

[30] Foreign Application Priority Data

Jun. 5, 1995 [JP] Japan .................. 7-137677

[51] Int. Cl.$^6$ ................... H05B 33/00
[52] U.S. Cl. ................ 428/690; 428/691; 428/917; 313/504; 313/506; 313/507; 313/508; 313/509
[58] Field of Search ................ 428/690, 917, 428/691; 313/504, 506, 507, 508, 509

[56] References Cited

U.S. PATENT DOCUMENTS 5,227,252 7/1993 Murayama et al. .............. 428/690

FOREIGN PATENT DOCUMENTS 57-51781 3/1982 Japan .
63-295695 12/1988 Japan .

OTHER PUBLICATIONS

"Observation of Organic Thin Film for El Devices", Japan Society of Applied Physics, Spring 1993, 30a–SZK–1 In Japanese.

"Observation of vapor–deposited TPD films by AFM/FFM", Japan Society of Applied Physics, Autumn 1993, 29a–ZC–8 In Japanese.

"Molecularly Doped Polymers as a Hole Transport Layer in Organic Electroluminescent Devices", KIDO et al., Japanese Journal of Applied Physics, vol. 31, 1992, L 960 Japanese.

"Organic EL devices with quinacridone dye as hole transport layer", Japan Society of Applied Physics, Spring 1992, 28p–Q–9 In Japanese.

Primary Examiner—Charles Nold
Attorney, Agent, or Firm—Popham, Haik, Schnobrich & Kaufman, Ltd.

[57] ABSTRACT

In an organic thin film EL device comprising an anode layer, a cathode layer, and a complex layer including hole injection material and luminescent material, an anode interfacial layer is formed between the anode layer and the complex layer. The anode interfacial layer includes quinacridone derivative.

2 Claims, 1 Drawing Sheet

ORGANIC THIN FILM EL DEVICE HAVING LONG LIFETIME

BACKGROUND OF THE INVENTION

This invention relates to an organic thin film EL (Electroluminescent) device which is particularly used as a flat panel light source and a display.

An EL device has attracted much interest because of its application as a selfluminous panel-shaped display device. In particular, the organic thin film EL device uses organic material as luminescent material and generates light by high luminous efficiency and high luminance by supplying a supply voltage lower than 10 (V). The organic thin film EL device has several basic structures. One of those structures comprises an anode layer, a hole injection transport layer, an emitting layer, and a cathode layer which are formed on a substrate in this order. Another structure comprises the anode layer, the emitting layer, an electron injection transport layer, and the cathode layer which are formed on the substrate in this order. Other one structure comprises the anode layer, the hole injection transport layer, the emitting layer, the electron injection transport layer, and the cathode layer which are formed on the substrate in this order.

The conventional organic thin film EL device generally comprises a deposited film of aromatic amine as the hole injection transport layer. In particular, it tends to use 1,1-bis(4-diparatolylaminophenyl) cyclohexane, or N,N'-diphenyl-N,N'-bis(3-methylphenyl)-1,1'-biphenyl-4,4'-diamine because of a merit of hole injection characteristic and excellent flatness of the film. Although the deposited film made from the above-mentioned material has uniformity just after deposition process, cohesion in the deposited film considerably progresses few days after. This fact is disclosed in Proceedings contributed to Japan Society of Applied Physics, spring, 93, 30a-SZK-1 and in Proceedings contributed to Japan Society of Applied Physics, autumn, 93, 29a-ZC-8. For the above-mentioned reason, the organic thin film EL device has degradation. Furthermore, the organic thin film EL device has a low glass transition point within a range from 60° C. to 80° C. at most.

Generally, it is regarded that the degradation of the organic thin film EL device is caused because the aromatic amine has the low glass transition point lower than 100° C. This means that the characteristic of the organic thin film EL device is greatly influenced by the film characteristic of an organic layer. For the reason, it is important for the organic thin film EL device to form the film which has homogeneous film characteristic and excellent adhesiveness of an interface to be contacted with another film.

On the other hand, the method using porphyrin chemical compound in the hole injection layer is disclosed in Japanese Unexamined Patent Publication No. Tokkai-Sho 57-51781 (51781/1982). However, the degradation of the organic thin film EL device is caused by the cohesion and crystallization of the hole injection layer after fabrication of the device. This is because the following reason. If organic low-molecular material is used alone, the crystallization and the cohesion progress as time goes by. As a result, it is hard to form the thin film which has the homogeneous film characteristic and which is stable for a long time.

In order to restrain the degradation of the device by improving the thermal stability of the hole injection transport layer, it can be considered that the hole injection transport layer comprises the film wherein the above-mentioned aromatic amine is dispersed into high polymer molecule binder. The hole injection transport layer can be formed by a wet deposition method such as a spin coat method, a dip coat method, or the like. The characteristic of the organic thin film EL device is reported by Kido et al in Japanese Journal of Applied Physics, Vol. 31, 1992, L 960. As disclosed in the report, although the device emits by the high luminance just after the fabrication of the device, the luminance decreases soon under a continuous emission mode at a constant supply voltage. This is caused by the following fact. Namely, the interface between the anode layer and the hole injection transport layer has degraded adhesiveness. For the reason, the hole injection transport layer peels from the anode layer. As a result, defective electrical contact causes between the anode layer and the hole injection transport layer.

Another example of the organic thin film EL device is disclosed in Japanese Unexamined Patent Publication No. Tokkai-Sho 63-295695 (namely, 295695/1988). In such a device, the hole injection transport layer comprises a porphyrin chemical compound layer having hole injection characteristic and an aromatic tertiary amine layer having the hole injection characteristic in order to improve the stability of the organic thin film EL device by reducing the number of pin holes. However, it is insufficient to improve the stability of the organic thin film EL device. This is because it is hard to realize the prevention of peeling of the hole injection transport layer and the prevention of the crystallization and the cohesion in the hole injection transport layer at the same time.

As obvious from the above description, although the organic thin film EL device has the high luminance characteristic, the lifetime thereof is shorter than that of another type of light emission device. This means that it is hard to put the device to practical use.

SUMMARY OF THE INVENTION

It is therefore an object of this invention to provide an organic thin film EL device having a long lifetime.

An organic thin film EL device according to this invention comprises an anode layer, a cathode layer, and a complex layer including hole injection material and luminescent material and formed between the anode layer and the cathode layer. At least one of the anode layer and the cathode layer is made from transparent material.

According to an aspect of this invention, the device further comprises an anode interfacial layer formed between the anode layer and the complex layer so as to contact with the anode layer. The anode interfacial layer includes quinacridone derivative which is represented by the following general formula given by:

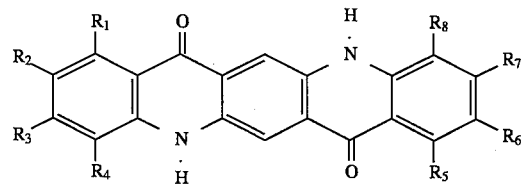

where each of R1 through R8 represents a hydrogen atom, a halogen atom, an alkyl group, a cycloalkyl group, an alkoxy group, an aralkyl group, a cyano group, an amide group, an alkoxycarbonyl group, an acyl group, a nitro group, a siloxy group, a hydroxyl group, displacement or non-displacement amino group, an alkenyl group, an allyl group, displacement or non-displacement aromatic hydrocarbon ring, and displacement or non-displacement aromatic heterocyclic, or where each pair composed of R1 and R2; R2 and R3; R3 and R4; R5 and R6; R6 and R7; and R7 and R8 is bonded together to provide the displacement or the non-displacement aromatic hydrocarbon ring or the displacement or the non-displacement aromatic heterocyclic.

DESCRIPTION OF THE PREFERRED EMBODIMENT

Figure 1:
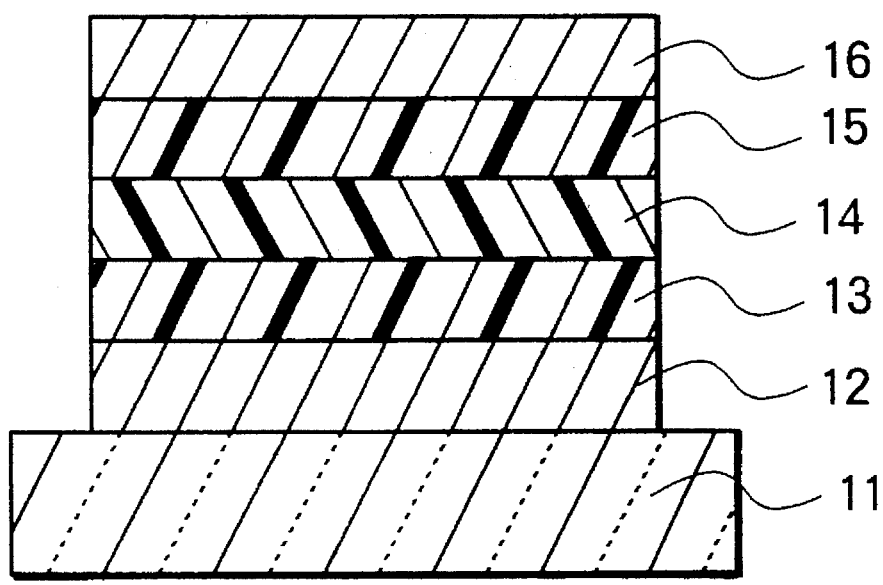
FIG. 1 is a cross-sectional view of an organic thin film EL device according to this invention.

Referring to FIG. 1, an organic thin film EL device according to a preferred embodiment of this invention comprises a substrate 11, an anode layer 12, an anode interfacial layer 13, a hole injection transport layer 14, an emitting layer 15, and a cathode layer 16. Each of the layers are formed on the substrate 11 in numbering order. This invention is characterized by the anode interfacial layer 13 formed between the anode layer 12 and the hole injection transport layer 14. This invention is based on the following point.

In the organic thin film EL device, a thin film having a high light transmittance is formed, as the anode layer, on a transparent substrate by the use of the material such as indium-tin-oxide, $SnO_2$, gold, or the like. Then, an organic layer is formed on the anode layer in a manner such as a vacuum deposition method, a coating method, or the like. The organic thin film has characteristic that it is apt to cause the cohesion because the organic thin film comprises molecular crystal and that it has degraded adhesiveness to the anode layer. For the reason, although the organic thin film EL device has the high luminance characteristic just after the fabrication, the luminance gradually decreases as time goes by. Under the circumstances, the applicant searched the material having the characteristic that deterioration with lapse of time is low in a state of a thin film and that electrical contact with the anode layer is kept for a long time. As a result, the applicant discovered the fact that the quinacridone derivative is superior to solve the above-mentioned advantage.

Although examples of the quinacridone derivative are as follows, the present invention is not restricted by the following examples.

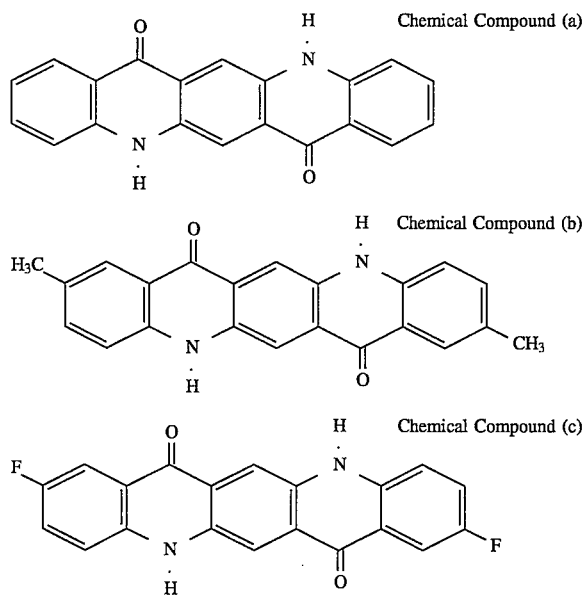

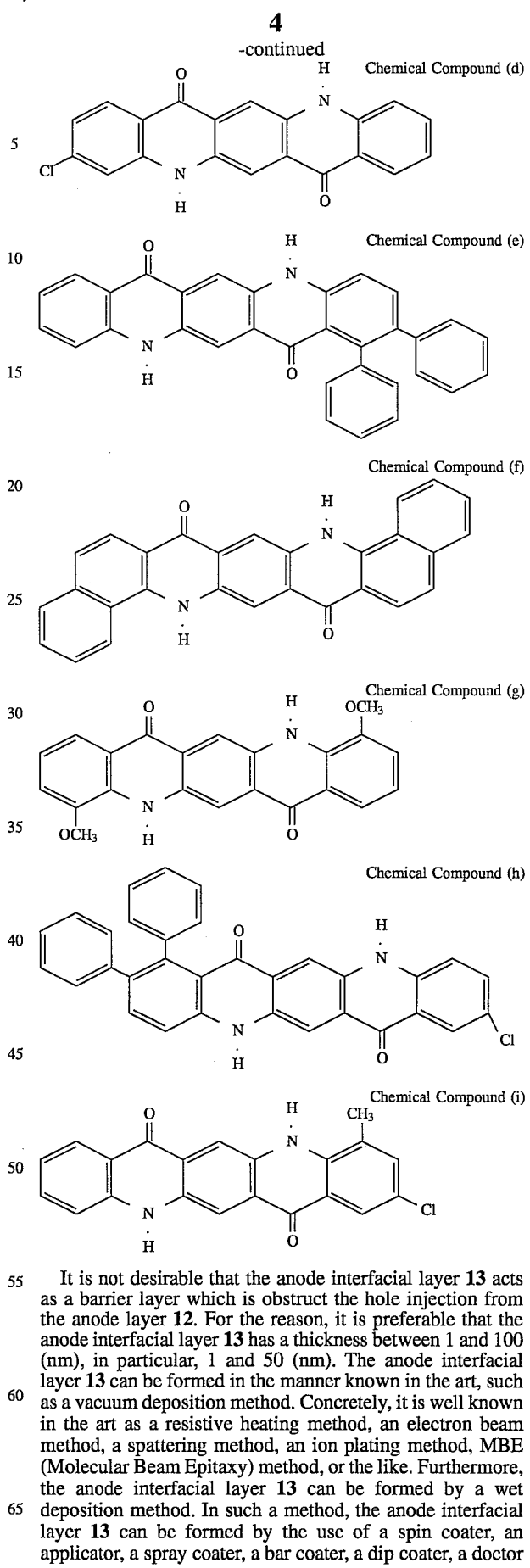

It is not desirable that the anode interfacial layer 13 acts as a barrier layer which is obstruct the hole injection from the anode layer 12. For the reason, it is preferable that the anode interfacial layer 13 has a thickness between 1 and 100 (nm), in particular, 1 and 50 (nm). The anode interfacial layer 13 can be formed in the manner known in the art, such as a vacuum deposition method. Concretely, it is well known in the art as a resistive heating method, an electron beam method, a spattering method, an ion plating method, MBE (Molecular Beam Epitaxy) method, or the like. Furthermore, the anode interfacial layer 13 can be formed by a wet deposition method. In such a method, the anode interfacial layer 13 can be formed by the use of a spin coater, an applicator, a spray coater, a bar coater, a dip coater, a doctor blade, a roller coater, a curtain coater, a bead coater, or the like. In this case, coating liquid is made by the use of solvent known in the art, such as, alcohols, aromatic hydrocarbons, ketones, esters, aliphatic halogen hydrocarbons, ethers, amidos, sulfoxides, or the like.

Moreover, the anode interfacial layer 13 may be realized by the film wherein the chemical compound given by the general formula (1) is dispersed into the polymer binder known in the art, such as, vinyl resin, acrylic resin, epoxy resin, silicone resin, styryl resin, polyimide, polysilylene, polyvinylcarbazole, polycarbonate, cellulose resin, polyolefin resin, or natural resin such as glue, gelatin. The above-mentioned film can be formed in the manner known in the art. For example, the above-mentioned wet deposition method can be applied by solving the polymer binder into the solvent. Accordingly, the wet deposition method is carried out by the use of the same device and the same solvent as mentioned above.

The anode interfacial layer 13 may includes two kinks of chemical compounds given by the general formula (1). Furthermore, the anode interfacial layer 13 may includes another chemical compound in addition to that given by the general formula (1). In this event, it is preferable that the anode interfacial layer 13 includes the chemical compound given by the general formula (1) greater than 10 percent by weight, more particular, greater than 50 percent by weight.

It is possible to improve the characteristic of the organic thin film EL device by changing the state of the anode interfacial layer 13. This can be realized by carrying out treatment of the anode interfacial layer 13. The treatment is carried out in the manner known in the art. For example, it may exposed to vaporized solvent. It may be soaked in the solvent. Moreover, the anode interfacial layer 13 may be heated at a suitable heating temperature.

The film including the hole injection transport material is formed on the anode interfacial layer 13. As mentioned before, the object of the present invention is to improve the electrically contact between the anode layer 12 and the anode interfacial layer 13 without reduction of the luminous efficiency. Accordingly, the organic thin film EL device is required to include the hole injection transport material in order to have hole transport ability and to block electrons and excitons. The hole injection transport material can be selected from the material known in the art. Concretely, it is desirable to use organic sensitized material, aromatic tertiary amine, or the like. Furthermore, it is possible to use electrically conductive polymer such as poly-(paraphenylenevinylen), polyaniline, or the like. It is possible to use polysilylene.

In proceedings contributed to Japan Society of Applied Physics, spring, 92, 28p-Q-9, it is reported that quinacridone is applied to the hole injection transport layer. However, the organic thin film EL device including the quinacridone has a degraded luminous efficiency, particularly, in blue emission, because the quinacridone has low blocking characteristic to the electrons and the excitons. Accordingly, the quinacridone is unsuitable for the hole injection transport material. Under the circumstances, it should be noted here that the hole injection transport layer according to the present invention no includes the quinacridone.

The film including the hole injection transport material may include luminescent material. Fluorescent material can be used as the luminescent material. The fluorescent material is often used as doping material or host material in the organic thin film EL device. Moreover, the film including the hole injection transport material may include electron injection transport material in addition to the luminescent material. The film including the hole injection transport material can be formed in the manner such as the vapor deposition method and the wet deposition method which are mentioned before.

Although several kinds of layers known in the art are formed onto the anode interfacial layer 13, the organic thin film EL device according to the present invention is not restricted by a combination of several kinds of layers. For example, a single hole injection transport layer or a plurality of hole injection transport layers may be formed onto the anode interfacial layer 13. The emitting layer 15 may be doped with suitable fluorescent material. A single electron injection transport layer or a plurality of electron injection transport layers may be formed onto the emitting layer 15.

According to the above-mentioned structure, it is possible to improve the stability of an anode interface contact with the anode layer 12. As a result, the organic thin film EL device according to the present invention has a long lifetime.

For a better understanding of the present invention, a comparative example will be described at first.

COMPARATIVE EXAMPLE

As the anode layer, the film is formed onto a glass substrate by the use of ITO (indium-tin-oxide) with a resistance of 15 ($\Omega/\square$). By the vacuum deposition, the hole injection transport layer is formed onto the anode layer by the use of the N,N'-diphenyl-N,N'-bis(3-methylphenyl)-1,1'-biphenyl-4,440-diamine with a thickness of 50 (nm). By the vacuum deposition, the emitting layer is formed onto the hole injection transport layer by the use of tris-(8-hydroxyquinolinol) aluminum with a thickness of 75 (nm). The cathode layer is formed, by the vacuum deposition, onto the emitting layer by the use of MgAg (evaporation rate ratio 10:1) with a thickness of 250 (nm).

As a result of observation of luminance characteristic of the above-mentioned device under air atmosphere, bright green emission can be obtained from the tris-(8-hydroxyquinolinol) aluminum. As a result of continuous emission under a constant current density of 6 (mA/cm$^2$), a supply voltage increased from 6.7 (V) to 18.5 (V) when 376 hours have passed. Furthermore, the device electrically destroyed as soon as luminance intensity decreased from 180 (cd/m$^2$) to 56 (cd/m$^2$).

Embodiment 1

As the anode layer 12, the film is formed onto a glass substrate by the use of ITO (indium-tin-oxide) with a resistance of 15 ($\Omega/\square$). By the vacuum deposition of the resistive heating method type, the anode interfacial layer 13 is formed onto the anode layer 12 by the use of the chemical compound (a) with a thickness of 5 (nm) without heating of the substrate. By the vacuum deposition, the hole injection transport layer 14 is formed onto the anode interfacial layer 13 by the use of the N,N'-diphenyl-N,N'-bis(3-methylphenyl)-1,1'-biphenyl-4,4'-diamine with a thickness of 50 (nm). The emitting layer 15 is formed, by the vacuum deposition, onto the hole injection transport layer 14 by the use of tris-(8-hydroxyquinolinol) aluminum with a thickness of 75 (nm). By the vacuum deposition, the cathode layer 16 is formed at last onto the emitting layer 15 by the use of MgAg (evaporation rate ratio 10:1) with a thickness of 250 (nm).

As a result of observation of luminance characteristic of the above-mentioned organic thin film EL device under air atmosphere, bright green emission can be obtained from the tris-(8-hydroxyquinolinol) aluminum. As a result of continuous emission under a constant current density of 6 (mA/cm$^2$), plane luminous continued even when 500 hours have passed. At this time, a supply voltage increased from 6.8 (V) to 7.9 (V). A luminance intensity decreased from 230 (cd/m$^2$) to 150 (cd/m$^2$). This means that the organic thin film EL device is superior relative to the comparative example in lifetime.

Embodiments 2 to 9

Although the organic thin film EL device is fabricated in the same manner as the Embodiment (1), the anode interfacial layer 13 is formed by the use of one of the chemical compounds (b) to (i). As a result of observation of luminance characteristics of these above-mentioned devices under air atmosphere, bright green emission can be obtained from the tris-(8-hydroxyquinolinol) aluminum in each of the Embodiments (2) to (9). Table (1) shows the luminance intensity at an initial state and after 500 hours and the supply voltage at the initial state and after 500 hours in each of the Embodiments (2) to (9) on continuous emission under a constant current density of 6 (mA/cm$^2$).

TABLE 1

| Embodiments | Chemical Compound | Initial Luminance Intensity (cd/m$^2$) | Initial Supply Voltage (V) | Luminance Intensity after 500 hours (cd/m$^2$) | Supply Voltage after 500 hours (V) |
| --- | --- | --- | --- | --- | --- |
| 2 | b | 240 | 7.0 | 150 | 8.1 |
| 3 | c | 220 | 6.9 | 160 | 8.0 |
| 4 | d | 200 | 6.5 | 140 | 7.7 |
| 5 | e | 230 | 7.0 | 170 | 8.3 |
| 6 | f | 190 | 6.4 | 120 | 7.6 |
| 7 | g | 220 | 6.8 | 130 | 8.2 |
| 8 | h | 210 | 6.9 | 150 | 8.5 |
| 9 | i | 220 | 6.8 | 140 | 8.1 |

Embodiment 10

As the anode layer 12, the film is formed onto a glass substrate by the use of ITO with a resistance of 15 ($\Omega/\square$). By the vacuum deposition of the resistive heating method type, the anode interfacial layer 13 is formed onto the anode layer 12 by the use of the chemical compound (a) with a thickness of 5 (nm) without heating of the substrate. The hole injection transport layer 14 is formed, by the vacuum deposition, onto the anode interfacial layer 13 by the use of the 1,1-bis(4-diparatolylaminophenyl) cyclohexane with a thickness of 50 (nm). As the emitting layer 15, the tris-(8-hydroxyquinolinol) aluminum and DCM are codeposited, by the vacuum deposition, onto the hole injection transport layer 14 at the evaporation rate ratio 100:1 with a thickness of 60 (nm). The cathode layer 16 is formed, by the vacuum deposition, onto the emitting layer 15 by the use of MgAg (evaporation rate ratio 10:1) with a thickness of 250 (nm). The DCM is represented by the following chemical formula (A) given by,

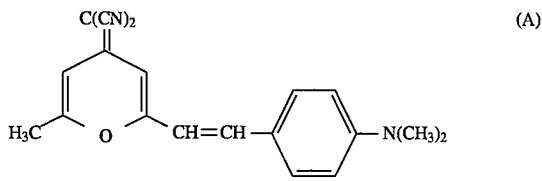

As a result of observation of luminance characteristic of the Embodiment 10 under air atmosphere, bright orange emission can be obtained from the DCM. As a result of continuous emission under a constant current density of 6 (mA/cm$^2$), plane luminous continued even when 500 hours have passed. At this time, a supply voltage increased from 4.9 (V) to 5.6 (V). A luminance intensity decreased from 490 (cd/m$^2$) to 400 (cd/m$^2$).

Embodiment 11

Although the organic thin film EL device is fabricated in the same manner as the Embodiment (1), the cathode layer 16 is formed by the use of AlLi (evaporation rate ratio 100:1) with a thickness of 250 (nm) by the vacuum deposition.

As a result of observation of luminance characteristics of the above-mentioned embodiment under air atmosphere, bright green emission can be obtained from the tris-(8-hydroxyquinolinol) aluminum. As a result of continuous emission under a constant current density of 6 (mA/cm$^2$), plane luminous continued even when 500 hours have passed. At this time, a supply voltage increased from 6.6 (V) to 7.6 (V). A luminance intensity decreased from 250 (cd/m$^2$) to 160 (cd/m$^2$).

Embodiment 12

Although the organic thin film EL device is fabricated in the same manner as the Embodiment (1), the anode layer 12 is formed by the use of SnO$_2$ with a resistance of 100 ($\Omega/\square$).

As a result of observation of luminance characteristics of the above-mentioned embodiment under air atmosphere, bright green emission can be obtained from the tris-(8-hydroxyquinolinol) aluminum. As a result of continuous emission under a constant current density of 6 (mA/cm$^2$), plane luminous continued even when 500 hours have passed. At this time, a supply voltage increased from 7.0 (V) to 7.8 (V). A luminance intensity decreased from 210 (cd/m$^2$) to 130 (cd/m$^2$).

Embodiment 13

The anode layer 12 is formed onto a glass substrate by the use of ITO with a resistance of 15 ($\Omega/\square$). By the vacuum deposition, the anode interfacial layer 13 is formed onto the anode layer 12 by the use of the chemical compound (a) with a thickness of 10 (nm) without heating of the substrate. The hole injection transport layer 14 is formed onto the anode interfacial layer 13 by the dip coat method. In the dip coat method, the coating liquid is made at first by mixing the N,N'-diphenyl-N,N'-bis(3-methylphenyl)-1,1'-biphenyl-4,4'-diamine and polycarbonate z200 (Mitsubishi Gas Chemical Co. Ltd.) by weight ratio of 1:1 and then by solving the mixture thereof into dichloromethane by weight percent of 1. Next, the film is formed by the use of the coating liquid by the dip coat method. The film is dried with a temperature of 80 (°C.) for one hour. A total thickness of the anode interfacial layer 13 and the hole injection transport layer 14 is equal to 63 (nm). The emitting layer 15 is formed, by the vacuum deposition, onto the hole injection transport layer 14 by the use of tris-(8-hydroxyquinolinol) aluminum with a thickness of 75 (nm). By the vacuum deposition, the cathode layer 16 is formed at last onto the emitting layer 15 by the use of MgAg (evaporation rate ratio 10:1) with a thickness of 250 (nm).

As a result of observation of luminance characteristic of the above-mentioned organic thin film EL device under air atmosphere, bright green emission can be obtained from the tris-(8-hydroxyquinolinol) aluminum. As a result of continuous emission under a constant current density of 6 (mA/cm$^2$), plane luminous continued even when 500 hours have passed. At this time, a supply voltage increased from 6.5 (V) to 7.6 (V). A luminance intensity decreased from 180 (cd/m$^2$) to 110 (cd/m$^2$).

Embodiment 14

The anode layer 12 is formed onto a glass substrate by the use of ITO with a resistance of 15 ($\Omega/\square$). By the vacuum deposition, the anode interfacial layer 13 is formed onto the anode layer 12 by the use of the chemical compound (a) with a thickness of 10 (nm) without heating of the substrate. An organic layer is formed onto the anode interfacial layer 13 by the dip coat method. In the dip coat method, the coating liquid is made at first by mixing the electron injection transport material, the luminescent material, and the hole injection transport material by weight ratio of 30:1:70 and then by solving the mixture thereof into dichloromethane by weight percent of 2. Bu-PBD is used as the electron injection transport material and is given by the following chemical formula (B). As the luminescent material, coumarin 6 is used and is given by the following chemical formula (C). As the hole injection transport material, poly(N-vinylcarbazole) is used. Next, the film is formed by the use of the coating liquid by the dip coat method. The film is dried with a temperature of 80 (°C.) for one hour. A total thickness of the organic layer is equal to 70 (nm). By the vacuum deposition, the cathode layer 16 is formed at last onto the organic layer by the use of MgAg (evaporation rate ratio 10:1) with a thickness of 250 (nm).

As a result of observation of luminance characteristic of the above-mentioned organic thin film EL device under air atmosphere, bright green emission can be obtained from the coumarin 6. As a result of continuous emission under a constant current density of 6 (mA/cm$^2$), plane luminous continued even when 500 hours have passed. At this time, a supply voltage increased from 6.2 (V) to 7.5 (V). A luminance intensity decreased from 310 (cd/m$^2$) to 200 (cd/m$^2$).

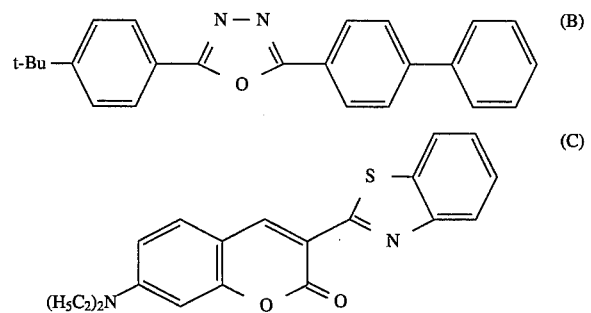

Embodiment 15

Although the organic thin film EL device is fabricated in the same manner as the Embodiment (1), the substrate is dipped into tetrahydrofuran after deposition of the anode interfacial layer 13. Then, the substrate is dried with a temperature of 80 (°C.) for a half hour.

As a result of observation of luminance characteristics of these above-mentioned devices under air atmosphere, bright green emission can be obtained from the tris-(8-hydroxyquinolinol) aluminum. As a result of continuous emission under a constant current density of 6 (mA/cm$^2$), plane luminous continued even when 500 hours have passed. At this time, a supply voltage increased from 6.3 (V) to 7.1 (V). A luminance intensity decreased from 220 (cd/m$^2$) to 170 (cd/m$^2$).

Embodiment 16

Although the organic thin film EL device is fabricated in the same manner as the Embodiment (1), the substrate is heated at a temperature of 120 (°C.) for two hours after deposition of the anode interfacial layer 13.

As a result of observation of luminance characteristics of these above-mentioned devices under air atmosphere, bright green emission can be obtained from the tris-(8-hydroxyquinolinol) aluminum. As a result of continuous emission under a constant current density of 6 (mA/cm$^2$), plane luminous continued even when 500 hours have passed. At this time, a supply voltage increased from 6.4 (V) to 7.5 (V). A luminance intensity decreased from 220 (cd/m$^2$) to 150 (cd/m$^2$).

What is claimed is:

1. An organic thin film EL device comprising an anode layer, a cathode layer, and a complex layer including hole injection material and luminescent material and formed between said anode layer and said cathode layer, at least one of said anode layer and said cathode layer being made from transparent material, said device further comprising:

an anode interfacial layer formed between said anode layer and said complex layer so as to contact with said anode layer, said anode interfacial layer including quinacridone derivative which is represented by the following general formula given by:

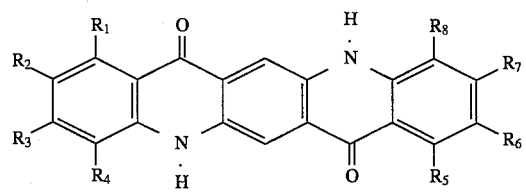

where each of R1 through R8 represents a hydrogen atom, a halogen atom, an alkyl group, a cycloalkyl group, an alkoxy group, an aralkyl group, a cyano group, an amide group, an alkoxycarbonyl group, an acyl group, a nitro group, a siloxy group, a hydroxyl group, displacement or non-displacement amino group, an alkenyl group, an allyl group, displacement or non-displacement aromatic hydrocarbon ring, and displacement or non-displacement aromatic heterocyclic, or where each pair composed of R1 and R2; R2 and R3; R3 and R4; R5 and R6; R6 and R7; and R7 and R8 is bonded to to provide the displacement or the non-displacement aromatic hydrocarbon ring or the displacement or the non-displacement aromatic heterocyclic.

2. An organic thin film EL device as claimed in claim 1, wherein said complex layer comprises a hole injection transport layer including hole injection material and an emitting layer including luminescent material, said anode interfacial layer being formed between said anode layer and said hole injection transport layer.

* * * * *